(12) United States Patent
Mergler et al.

(10) Patent No.: US 8,060,688 B2
(45) Date of Patent: Nov. 15, 2011

(54) METHOD AND DEVICE FOR RECONFIGURATION OF RELIABILITY DATA IN FLASH EEPROM STORAGE PAGES

(75) Inventors: Iwo Mergler, Miranda (GB); Michael James, Hamble (GB); Robert Manning, Burgess Hill (GB)

(73) Assignee: NXP B.V., Eindhoven (NL)

( * ) Notice: Subject to any disclaimer, the term of this patent is extended or adjusted under 35 U.S.C. 154(b) by 374 days.

(21) Appl. No.: 12/517,000

(22) PCT Filed: Dec. 3, 2007

(86) PCT No.: PCT/IB2007/054896
§ 371 (c)(1),
(2), (4) Date: May 29, 2009

(87) PCT Pub. No.: WO2008/068706
PCT Pub. Date: Jun. 12, 2008

(65) Prior Publication Data
US 2010/0070686 A1    Mar. 18, 2010

(30) Foreign Application Priority Data
Dec. 7, 2006    (EP) .................................. 06125635

(51) Int. Cl.
*G06F 13/00*    (2006.01)
*G11C 29/00*    (2006.01)
(52) U.S. Cl. .......................................... 711/103; 714/763
(58) Field of Classification Search .................. 711/103
See application file for complete search history.

(56) References Cited

U.S. PATENT DOCUMENTS 5,603,001 A * 2/1997 Sukegawa et al. ............ 711/103
5,606,532 A   2/1997 Lambrache et al.
(Continued)

FOREIGN PATENT DOCUMENTS
EP    1577774 A    9/2005

OTHER PUBLICATIONS

Sandisk; "Sandisk Shark AMBA Bus NAND Interface Technical Reference—Draft 1.06"; Sunnyvale, CA; 2002; 85 Pages.

*Primary Examiner* — Son Mai

(57) ABSTRACT

A data processing system comprises a Flash memory (120) having a storage space partitioned in a plurality of storage pages (P'). Each storage page comprises a memory reliability indicator indicative for the reliability of a storage region of the memory. Coupled to the Flash memory is a controller (150) for the Flash memory, that includes a facility for protecting data against errors occurring during storage in the Flash memory and for detecting and/or correcting errors in the data stored in the data, when retrieved from the Flash memory. A data processing unit (100) is coupled to the controller (150) that has access to a working page (P) comprising a first section of user data and a second section of management information, including a memory reliability indicator. The data processing system is characterized by a data re-arranging facility (105) for subdividing the data in the work page into a plurality of portions. Each portion comprises a part of the user data, and the last portion additionally comprises the management information including the memory reliability indicator. The controller (150) is arranged to subsequently generate redundant data for each of those portions and to write the content of the subsequent portions with its respective redundant data to the storage page (122).

5 Claims, 4 Drawing Sheets

U.S. PATENT DOCUMENTS

| | | |
|---|---|---|
| 6,041,001 A | 3/2000 | Estakhri |
| 6,684,289 B1 * | 1/2004 | Gonzalez et al. ............. 711/103 |
| 7,475,184 B2 * | 1/2009 | Lee ............................... 711/103 |
| 7,849,381 B2 * | 12/2010 | Tomlin .......................... 714/763 |
| 7,877,665 B2 * | 1/2011 | Mokhlesi ...................... 714/763 |
| 2004/0083334 A1 | 4/2004 | Chang et al. |
| 2006/0114726 A1 | 6/2006 | Kozakai et al. |
| 2007/0089023 A1 * | 4/2007 | Sanders ........................ 714/758 |
| 2008/0002469 A1 * | 1/2008 | Ishimoto ................... 365/185.17 |
| 2010/0281341 A1 * | 11/2010 | Wu et al. ....................... 714/763 |

* cited by examiner

METHOD AND DEVICE FOR RECONFIGURATION OF RELIABILITY DATA IN FLASH EEPROM STORAGE PAGES

FIELD OF THE INVENTION

The invention relates to a method for reading data from a Flash memory. The method further relates to a data processing device.

BACKGROUND OF THE INVENTION

Modern IC designs are more and more based on pre-existing functional units (IP-units) that are reused in a new combination. Such IP-units may comprise for example data processing units, storage units and interface units. Flash-memory, in particular NAND Flash memory is usually applied as a non-volatile storage medium.

Flash-memory is organized as large plurality (typically thousands) of storage blocks. Each storage block is subdivided in number (typically some tens, e.g. 32 or 64) of storage pages. The contents of the Flash-memory cannot be modified arbitrarily. Data can only be erased on a storage block basis and written on a storage page basis. Accordingly if new data is written to the Flash-memory, this is only possible if it is part of an entire storage page that is written. Writing a storage page is only possible if that storage page was still erased. Otherwise, first the storage block to which the storage page belongs has to be erased.

An important difference between Flash-memory and other solid-state memories is that, when shipped, it is not guaranteed that all memory cells in a Flash-memory device operate correctly. It may be the case that some memory cells fail. During operation the number of erroneous memory cells may even increase. Hence, redundant data is required to detect errors, and preferably to recover the data from failing memory cells. Redundant data will also be denoted here as ECC data.

To facilitate error correction the Flash-memory device reserves space for storage of ECC-data in addition to the data that was originally intended for storage (user data). An ECC unit provides for the calculation of the ECC-data from the user data and for correcting the stored user data using the ECC-data. Various error correcting detecting methods are known, including for example Reed-Solomon and the Hamming method.

The earlier versions of Flash-memory typically have a storage page size of 528 bytes. The storage space includes room for storage of user data, for storage of ECC-data.

Outside the user data and the ECC-data, the storage pages of the Flash-memory also provide an additional space of a few bytes for storage of data known as Out Of Band data (OOB). Flash based file systems typically use this additional space to store metadata, like, for instance, information about the health of the page (defect or not). In addition the additional space is used by the manufacturer to store memory reliability data in order to mark a defective storage block. This location is the only one which is guaranteed to be correctly readable. The additional space may be more robust in the implementation of the Flash-memory. But this is not a requirement. It is however guaranteed by the manufacturer to be readable. Any device for which this is not the case will not be shipped.

The test procedure that each Flash-memory chip undergoes in the factory is quite elaborate to reliably detect faulty storage blocks. For example, during these tests the chips are stressed with higher and lower temperatures and higher and lower supply voltages. It is strongly advised to use the memory reliability data, as it may significantly reduce the chance of data loss.

In most older, small page Flash-memory chips the first 512 of the 528 bytes are reserved for user data, the next 6 bytes for OOB-data, and the last 10 bytes for ECC-data. One bad block marking scheme that is applied in those older Flash-memory chips, is that the $517^{th}$ byte of the page (the sixth byte in the spare area), in the first and second page of each storage block indicates whether the storage block is unreliable. If this byte is unequal to 0xFF, the storage block should be considered unreliable. For 16-bit devices holds that the bad block marking is placed in the $256^{th}$ and the $261^{th}$ word (the first and the sixth word of the additional space) of the first and the second page of each block.

Commonly available Flash-memory IP is based on 512+16 byte pages. The interface accelerates reading and writing of Flash-memory by providing hardware ECC. The ECC hardware detects, and optionally attempts to correct errors.

However, most large Flash-memory devices are now only available in larger storage page sizes e.g. 2 Kbytes, and even devices with 4 kB storage pages are under development. These modern Flash-memory devices are not compatible with the commonly available Flash-memory interface IP. Those larger page devices have another arrangement of OOB-data within the user data and ECC-data. For example in the 2 Kbyte page the first 2048 is intended for user data, the next 24 bytes for OOB-data and the last 40 bytes for ECC-data.

The common way of overcoming this incompatibility is to treat the large page as a collection of small ones, each with it's own ECC.

This would necessitate transferring the OOB-data to a different location in the large page, which is not guaranteed to be correctly readable. Additionally software compatibility is lost.

SUMMARY OF THE INVENTION

It is a purpose of the invention to provide a method of storing the data provided by the IP-block in the Flash memory that prevents that the OOB-data is lost.

It is a further purpose of the invention to provide a data processing system that during operation provides for storage of the data while preventing that OOB data is lost.

According to the present invention these purposes are achieved by the method for reading data as claimed in claim 1, a method for storing data as claimed in claim 3 and the data processing system as claimed in claim 4.

The method according to claim 1 allows using an application suitable for use with a Flash memory having a relatively large page size, while reusing an error correction/detection facility suitable for a Flash memory having a relatively small page size.

The method according to claim 3 allows using an application suitable for use with a Flash memory having a relatively large page size, while reusing an error protection facility suitable for a Flash memory having a relatively small page size.

Likewise the data processing system as claimed in claim 4 and claim 5 allows using an application suitable for use with a Flash memory having a relatively large page size, while reusing an error protection facility suitable for a Flash memory having a relatively small page size.

At startup the application usually scans the entire Flash memory, and for each storage block of the Flash memory it verifies the memory reliability indicator. During this process a bad block table is constructed in a memory, e.g. a volatile memory, e.g. a DRAM. The bad block table may for example comprise a list of pointers to the bad blocks, or simply a list indicating for each block whether it is reliable or not.

If during operation the controller detects an amount of errors exceeding a predetermined level for a block, then the memory reliability indicator for said block is updated. A new value for the indicator indicating that the block is unreliable is stored in the Flash memory. In the method and system according to the invention the reliability indicator has the same relative position in the work page as in the storage page. Accordingly the reliability indicator is reliably stored, as the manufacturer either uses a more robust technology for storage of the original indicator, or extensive testing has guaranteed that this storage space is reliable.

The data arrangement obtained in this way is surprising. The skilled person aiming to reuse an error protection/detection/correction facility intended for a Flash memory with relatively small storage pages in data processing system with relatively large storage pages would divide the user data of the working page in equal portions. This would have the consequence that the reliability indicator is stored in the storage page at a relative position deviating from that of the position which is guaranteed to be reliable.

BRIEF DESCRIPTION OF THE DRAWINGS

These and other aspects of the inventions are described in more detail with reference to the drawing. Therein.

DETAILED DESCRIPTION OF THE EMBODIMENTS

Figure 1:
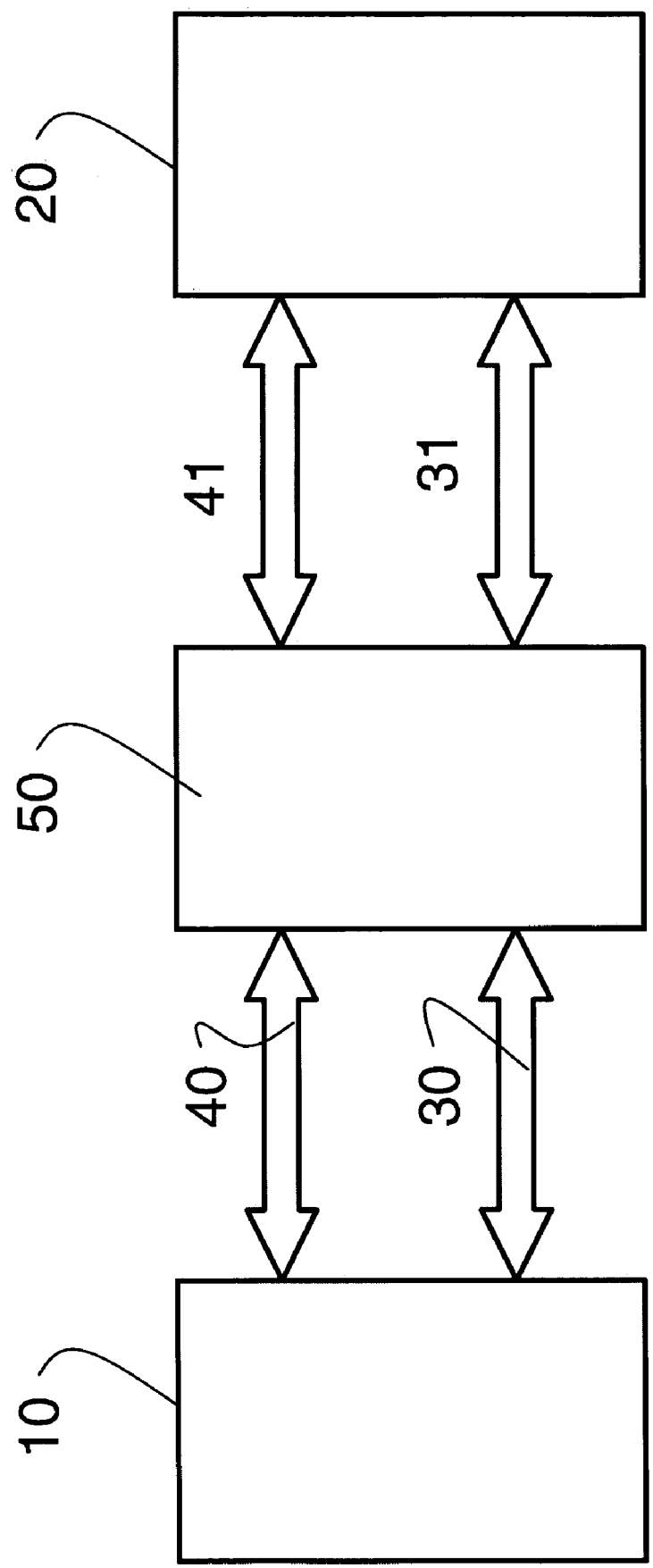
FIG. 1 schematically shows a prior art electronic device.

FIG. 1 schematically shows a prior art electronic device, comprising a data-processing unit 10 for providing and/or consuming data and a Flash-memory 20. The data processing unit is coupled via a data bus 30 and control lines 40 to an interface 50 that controls the Flash memory 20. The interface 50 on its turn is coupled via a data bus 31 and control lines 41 to the Flash memory.

The data-processing unit 10 is for example a processor, e.g. a digital signal processor, but may alternatively be a memory, e.g. an SRAM.

Figure 2:
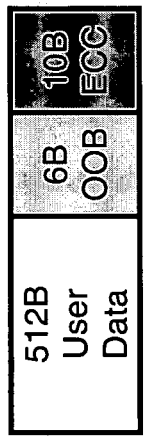
FIG. 2 shows a first storage convention for a first type of Flash-memory device.

The interface 50 and the Flash-memory 20 are designed to exchange data via the data bus 31. The data is stored in storage pages of the Flash-memory according to the format as shown in FIG. 2. The storage pages have a size of N data-units. In this case N=528, wherein the data units are bytes. In the storage page a first section with 512 bytes is reserved for user data, a second section of in total 6 bytes includes management data including memory reliability data (denoted as OOB) and a third section is reserved for 10 bytes of redundant data. The redundant data may include any data that allows for detection and/or correction of errors in the user data. The redundant data is denoted as ECC in the Figures. The memory reliability data may include an indication indicative for the reliability of the location where the storage page is stored in the Flash-memory, or for a set of locations (e.g. a block) comprising the storage page. The indication is usually provided by the manufacturer of the memory and based on a rigorous testing procedure. However, an indication originally indicating that a storage location is reliable may be assigned a value indicative for unreliability if the data processing unit 10 or an application being processed thereon detected unrecoverable errors occurring when attempting to read the page.

Figure 3:
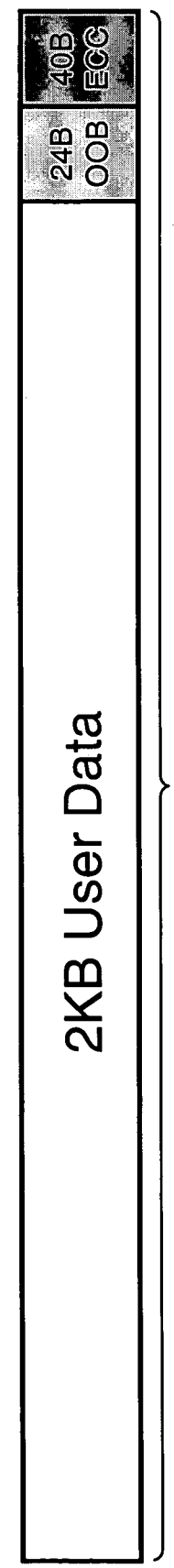
FIG. 3 shows a second storage convention for a second type of Flash-memory device.

Flash-memory having a page size of 528 bytes has been generally used for a long time. However, gradually Flash-memory types with larger sized storage pages (macro-pages) have been developed. FIG. 3 shows by way of example the layout of a storage-page of such a more modern Flash-memory. In that example the storage-page has a total size of 2112 bytes and comprises a first section of 2048 byte for user data, a second section of 24 bytes for management data, including the reliability data, and a third section of 40 bytes for redundant data.

It is desirable to be able to use an existing interface with newer types of Flash-memory in order to prevent that each unit has to be developed from scratch.

Figure 4:
FIG. 4 shows a conventional way of storing data in a second type of Flash-memory device.

FIG. 4 shows the common way in which this is achieved. Therein simply a sequence of data packets (here 4 packets) that are each formatted in the format as shown in FIG. 2 for Flash memory using the smaller page size are stored in the macro-page. This has the disadvantage that the memory reliability data is stored in a location that is less reliable than the location selected by the manufacturer.

Figure 6:
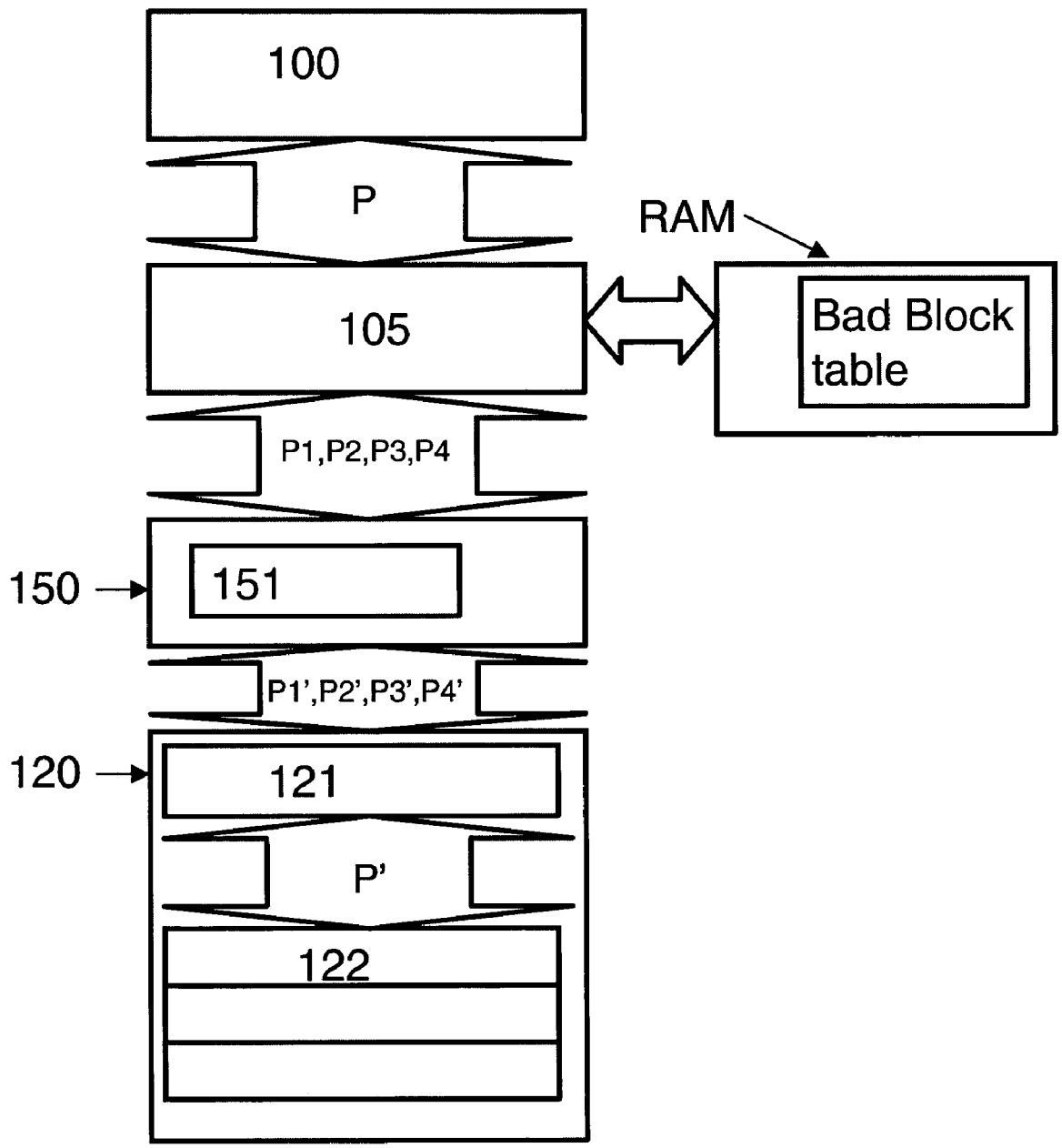
FIG. 6 schematically shows a device according to the invention.

FIG. 6 shows an embodiment of a data processing system according to the invention. The data processing system comprises a Flash memory 120 having a storage space partitioned in a plurality of storage pages. Each storage page comprises a memory reliability indicator indicative for the reliability of a storage region of the memory.

An interface 150, also denoted as controller, for the Flash memory is coupled thereto that includes a facility for protecting data against errors occurring during storage in the Flash memory 120 and for detecting and/or correcting errors in the data, when retrieved from the Flash memory 120.

A data processing unit 100 is coupled to the controller 150. The data processing unit has access to a work page P. The data processing system further includes a data re-arranging facility 105 for subdividing the data in the work page P into a plurality of portions P1, P2, P3, P4. Each portion comprises a part of the user data, and the last portion additionally comprises the management information including the memory reliability indicator. The controller 150 has a buffer 151 for storage of a portion. The controller 150 extends the portions P1, P2, P3, P4 with respective redundant data and writes these extended portions P1', P2', P3' and P4' to a buffer 121 of the Flash memory. If this buffer is full the Flash memory writes the content to one of its storage pages 122.

In the embodiment shown the work page P comprises 2048 bytes of user data and 24 bytes of management data. When writing to the Flash memory, the data is rearranged by rearrangement facility 105 in 4 portions wherein the first three portions P1, P2, P3 each comprise 518 bytes of user data. The last of the four portions P4 comprises 494 bytes of user data and the 24 bytes of management information.

Figure 5:
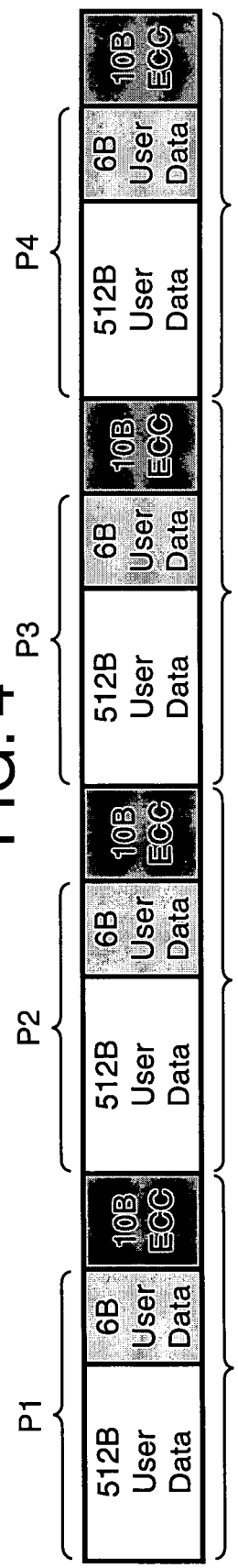
FIG. 5 shows a way of storing data in a second type of Flash-memory device with a method according to the invention.

Each time a portion is stored into the buffer 151 of the controller 150, the controller 150 calculates a number of 10 redundant bytes. The data finally stored in the pages 122 of the Flash memory is formatted as shown in FIG. 5. Accordingly the reliability indicator has the same relative position in the storage space as in the work page.

An application driven by processing unit 100 will usually generate a bad block table during start-up of the data processing system. In the data processing system of the present invention the controller 150 for the Flash memory 120 operates with pages having a relatively small size as compared to the size of the storage pages of the Flash memory. This has the advantage that the controller 150 only needs to transfer the part of the content of the storage page 122 that comprises the management data to obtain the reliability indicator. This saves time at start-up.

When reading, the controller 150 is arranged to retrieve the content of subsequent extended portions P1', P2', P3' and P4' of a storage page, and applying error detection and/or error correction to each portion. The data re-arranging facility 105 combines the corrected data of the extended portions into a work page P for use by the data processing unit 100. Therein, the corrected user data is contiguously arranged, and the reliability indicator has the same relative position as in the storage page P'.

Figure 7:
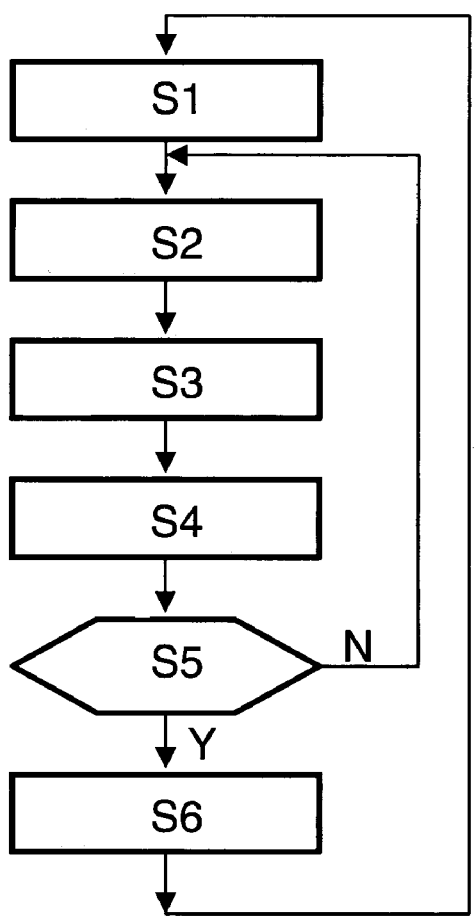
FIG. 7 shows a first method according to the invention.

FIG. 7 shows a first embodiment of a method according to the invention for reading data from a Flash memory.

In step S1 a counter n is initialized at 1

In step S2 portion n is read from the buffer 121 of the Flash memory.

In step S3 error detection/correction is applied to the portion n and the checked/corrected data is temporarily stored, for example in the work page.

In step S4 the counter is incremented by one.

In step S5 it is verified whether the value of the counter is greater than a value $2^M$.

If this is the case control flow continues with step S6.

Otherwise control flow returns to step S2.

In step S6 the data is re-arranged to the format shown in FIG. 3.

The steps S1 to S6 may be repeated after step S6 is completed.

Since the ECC-data is no longer required after error correction has taken place no additional buffer space is required for the re-arrangement than the space already used as workpage. Preferably rearrangement already takes place on the fly, when in step S3 the corrected data is stored.

In that step the user data for portion n may immediately be written after the user data for portion n−1. When writing the last portion, again writing starts at the first free location after the space written by the but one last portion. After writing the first 464 bytes of the last portion a space of 30 bytes is reserved. Subsequently the 24 bytes of management data is written to the work page, and then the last 30 bytes of user data in the last portion are written in the reserved space.

Figure 8:
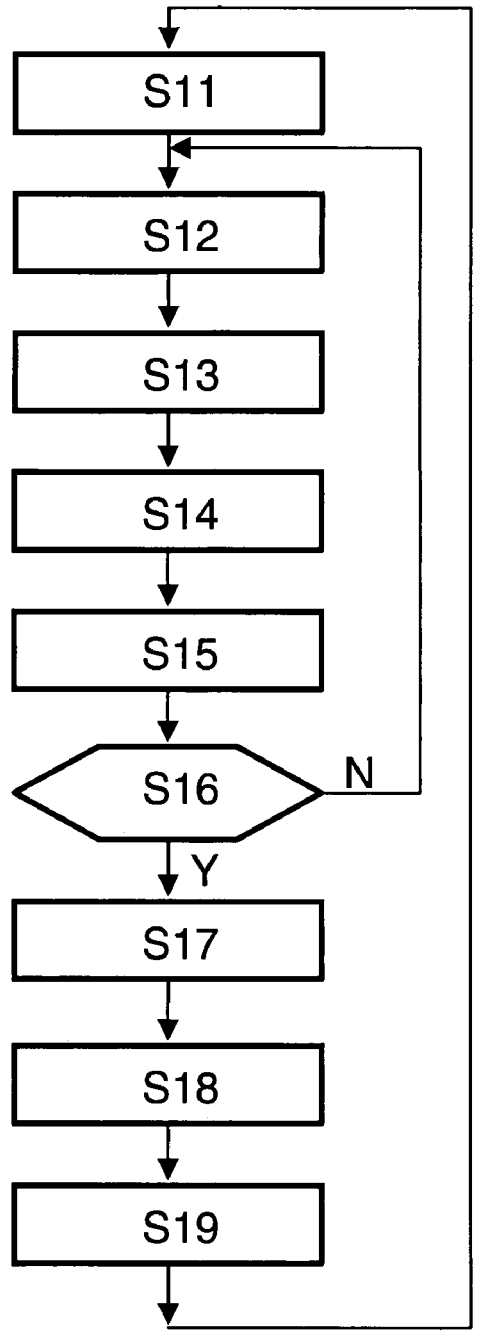
FIG. 8 shows a second method according to the invention.

FIG. 8 shows a method for storing data from a work page into a storage page of a Flash memory.

In step S11 a counter n is initialized at 1.

In step S12 a portion n of the user data is selected from the work-page.

In step S13 redundant data is created from the user data for error protection purposes.

In step S14 the user data and the redundant data is written to the storage page.

In step S15 the counter n is incremented by 1.

In step S16 it is verified whether the value of the counter is less than a value $2^M$.

If this is the case control flow returns to step S12.

Otherwise control flow continues with step S17.

In step S17a data packet is created from portion $2^M$ of the work-page, comprising a first amount of user data, here 464 bytes, the management data, here 24 bytes, and a second amount of user data, here 30 bytes.

In step S18 redundant data is created from the user data and management data for error protection purposes.

In step S19 the data packet including the redundant data is written to the storage page.

Now the data is re-arranged to the format shown in FIG. 5, so that the reliability indicator has the same relative position as in the work page.

An embodiment of the invention is described above that comprises a Flash memory with storage pages of size 2048 B (excl. 24 bytes of management data and 40 bytes of redundant data) and a controller that provides for error correction of pages of size 512 B (excl. 6 bytes of management data and 10 bytes of redundant data).

The invention is however equally applicable to other data processing systems where the controller operates on pages having a size smaller than that of the Flash memory controlled by it.

When using page formats as shown in the table below, any controller of type k, may be used with any Flash memory of type>k. Therein the column "user data" shows the number of user data bytes, the column "man data" shows the number of management data bytes, and the column "red. data" shows the number of redundant data bytes.

| Type | User data | Man. data | red. data |
|---|---|---|---|
| 1 | 512 | 6 | 10 |
| 2 | 1024 | 12 | 20 |
| 3 | 2048 | 24 | 40 |
| 4 | 4096 | 48 | 80 |

It is remarked that the scope of protection of the invention is not restricted to the embodiments described herein. Parts of the system may implemented in hardware, software or a combination thereof. For example, the controller 150 may be implemented by a generally programmable microcontroller which is suitably programmed. Alternatively however, the controller may be partly or completely be implemented by dedicated hardware. It may for example comprise dedicated hardware to rearrange the data on the fly. The various components may be provided as a single integrated circuit. Alternatively the components may be available as a chip set. Neither is the scope of protection of the invention restricted by the reference numerals in the claims. The word 'comprising' does not exclude other parts than those mentioned in a claim. The word 'a(n)' preceding an element does not exclude a plurality of those elements. Means forming part of the invention may both be implemented in the form of dedicated hardware or in the form of a programmed general purpose processor. The invention resides in each new feature or combination of features.

The invention claimed is:

1. Method for reading data from a Flash memory having data stored in a plurality of storage pages, each storage page comprising user data, redundant data and management data including a reliability indicator indicative for the reliability of a storage region of the memory, the method including the steps of:

reading the storage page in subsequent portions, each portion comprising a part of the user data and a part of the redundant data, and a last of the portions comprising in addition the management data with the reliability indicator, applying error detection/correction to each portion, combining the corrected data of the portions into a work page wherein the corrected user data is contiguously arranged, and the reliability indicator has the same relative position as in the storage page.

2. Method for reading data according to claim 1, wherein the redundant data is stored as a contiguous block of data in the work page.

3. Method for storing data from a work page into a storage page of a Flash memory, the data from the work page at least comprising a section of user data and management data including a memory reliability indicator, the method comprises the steps of:

subdividing the work page into a plurality of portions, each portion comprising a part of the user data, and the last portion additionally comprising the memory reliability indicator, applying error protection to each portion in order to create redundant data, storing the portions together as subsequent sections into a storage page wherein the reliability indicator has the same relative position as in the work page.

4. A data processing system comprising:

a Flash memory having a storage space partitioned in a plurality of storage pages, each storage page comprising management data including a memory reliability indicator indicative for the reliability of a storage region of the memory, a controller for the Flash memory, coupled to the Flash memory including a facility for protecting data against errors occurring during storage in the Flash memory and for detecting and/or correcting errors in the data stored in the data, when retrieved from the Flash memory, a data processing unit coupled to the controller that has access to a working page comprising a first section of user data and a second section of management information, including a memory reliability indicator, characterized by a data re-arranging facility for subdividing the data in the work page into a plurality of portions, each portion comprising a part of the user data, and the last portion additionally comprising the management information including the memory reliability indicator, and in that the controller is arranged to subsequently generate redundant data for each of those portions and to write the content of the subsequent portions with its respective redundant data to the storage page.

5. A data processing system according to claim 4 wherein the controller is further arranged to retrieve subsequent portions of the data obtained from the storage page and to apply error detection and-or correction to each portion, wherein the data re-arranging facility is further arranged for combining corrected data of the portions into a work page for use by the data processing unit, wherein the corrected user data is contiguously arranged, and wherein the reliability indicator has the same relative position as in the storage page.

* * * * *